United States Patent
Yarita et al.

(10) Patent No.: US 10,907,073 B2
(45) Date of Patent: Feb. 2, 2021

(54) POLISHING COMPOSITION

(71) Applicant: FUJIMI INCORPORATED, Aichi (JP)

(72) Inventors: Satoru Yarita, Aichi (JP); Yukinobu Yoshizaki, Aichi (JP)

(73) Assignee: FUJIMI INCORPORATED

( * ) Notice: Subject to any disclaimer, the term of this patent is extended or adjusted under 35 U.S.C. 154(b) by 0 days.

(21) Appl. No.: 16/476,705

(22) PCT Filed: Dec. 7, 2017

(86) PCT No.: PCT/JP2017/044018
§ 371 (c)(1),
(2) Date: Jul. 9, 2019

(87) PCT Pub. No.: WO2018/131341
PCT Pub. Date: Jul. 19, 2018

(65) Prior Publication Data
US 2019/0352536 A1 Nov. 21, 2019

(30) Foreign Application Priority Data

Jan. 11, 2017 (JP) .................................. 2017-002695

(51) Int. Cl.
*C09G 1/02* (2006.01)
*B24B 37/04* (2012.01)
*H01L 21/3105* (2006.01)
*H01L 21/321* (2006.01)

(52) U.S. Cl.
CPC .............. *C09G 1/02* (2013.01); *B24B 37/044* (2013.01); *H01L 21/31055* (2013.01); *H01L 21/3212* (2013.01)

(58) Field of Classification Search
CPC ......... B24B 37/00; B24B 37/044; C09G 1/02; C09G 1/00; C09K 3/14; H01L 21/31053; H01L 21/31055; H01L 21/3212
USPC ..... 252/79.1, 79.2, 79.3; 438/691, 692, 693, 438/694
See application file for complete search history.

(56) References Cited

U.S. PATENT DOCUMENTS

| | | | |
|---|---|---|---|
| 2001/0011515 A1 | 8/2001 | Aoki et al. | |
| 2001/0014534 A1* | 8/2001 | Aoki | H01L 21/02063 438/689 |
| 2009/0289217 A1 | 11/2009 | Sato et al. | |
| 2010/0301014 A1* | 12/2010 | Mizuno | C09G 1/02 216/83 |
| 2017/0081553 A1* | 3/2017 | Tamada | H01L 21/30625 |

FOREIGN PATENT DOCUMENTS

| | | |
|---|---|---|
| JP | 2001-207170 A | 7/2001 |
| JP | 2008-546214 A | 12/2008 |
| JP | 2013-041992 A | 2/2013 |
| JP | 2015-193417 A | 11/2015 |
| JP | 2016-069465 A | 5/2016 |
| WO | 2006/133249 | 12/2006 |
| WO | 2008/013226 A1 | 1/2008 |
| WO | 2009/096495 A1 | 8/2009 |

* cited by examiner

*Primary Examiner* — Lan Vinh
(74) *Attorney, Agent, or Firm* — Katten Munchin Rosenman LLP

(57) ABSTRACT

A polishing composition for use in polishing an object to be polished, which comprises abrasive grains, a dispersing medium, and an additive, wherein the abrasive grains are surface-modified, the additive is represented by the following formula 1:

(Formula 1)

$$R_3 - \underset{X_2}{\overset{X_1}{\underset{\|}{C}}} - N \underset{R_2}{\overset{R_1}{}}$$

wherein in the formula 1, $X_1$ is O or $NR_4$, $X_2$ is a single bond or $NR_5$, $R_1$ to $R_5$ are each independently a hydrogen atom; a hydroxy group; a nitro group; a nitroso group; a $C_{1-4}$ alkyl group optionally substituted with a carboxyl group, an amino group, or a hydroxy group; or $CONH_2$; with the proviso that $R_2$ and $R_5$ may form a ring; when $X_2$ is a single bond, $R_3$ is not a hydrogen atom, or $R_1$ to $R_3$ are not a methyl group; and when $X_2$ is $NR_5$ and three of $R_1$ to $R_3$ and $R_5$ are a hydrogen atom, the other one is not a hydrogen atom or a methyl group; and a pH is 5.0 or less. According to the present invention, a polishing composition capable of polishing not only polycrystalline silicon but also a silicon nitride film at high speed and also suppressing a polishing speed of a silicon oxide film is provided.

7 Claims, No Drawings

POLISHING COMPOSITION

TECHNICAL FIELD

The present invention relates to a polishing composition.

BACKGROUND ART

In recent years, new microfabrication technology is being developed along with high integration and high performance of LSI (Large Scale Integration). A chemical mechanical polishing (CMP) method is one of them, and is a technology frequently used for flattening an interlayer insulating film, metal plug formation, and buried interconnection (Damascene interconnection) in the LSI manufacturing process, particularly in a multilayer interconnection formation process.

The CMP has been applied to various steps in semiconductor manufacturing. One of the modes is, for example, application to a gate formation process in transistor production. In the transistor production, a film of a material such as a metal, silicon, silicon oxide, polycrystalline silicon, and silicon nitride is sometimes polished. In an attempt to improve productivity, there is a demand to polish each material at high speed. In order to meet such a demand, for example, a technology for improving a polishing speed of polycrystalline silicon is proposed in JP 2013-041992 A.

SUMMARY OF INVENTION

In the examination of the CMP application to various steps in semiconductor manufacturing, the present inventors have found that it may be preferable in manufacturing to polish not only polycrystalline silicon but also a silicon nitride film at high speed. Meanwhile, with respect to a silicon oxide film, they have found that it may be preferable in manufacturing to make a polishing speed as low as possible. However, there is no polishing composition that can polish not only polycrystalline silicon but also silicon nitride film at high speed and suppress a polishing speed of a silicon oxide film.

Thus, an object of the present invention is to provide a polishing composition capable of polishing not only polycrystalline silicon but also a silicon nitride film at high speed and also suppressing a polishing speed of a silicon oxide film.

The present inventors have conducted extensive research in order to solve the above problems. As a result, they have found that the above problems can be solved by a polishing composition for use in polishing an object to be polished, which includes abrasive grains, a dispersing medium, and an additive, wherein the abrasive grains are surface-modified, the additive is represented by the following formula 1:

[Chemical Formula 1]

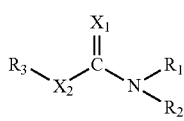

(Formula 1)

wherein in the formula 1, $X_1$ is O or $NR_4$, $X_2$ is a single bond or $NR_5$, $R_1$ to $R_5$ are each independently a hydrogen atom; a hydroxy group; a nitro group; a nitroso group; a $C_{1-4}$ alkyl group optionally substituted with a carboxyl group, an amino group, or a hydroxy group; or $CONH_2$; with the proviso that $R_2$ and $R_5$ may form a ring; when $X_2$ is a single bond, $R_3$ is not a hydrogen atom, or $R_1$ to $R_3$ are not a methyl group; and when $X_2$ is $NR_5$ and three of $R_1$ to $R_3$ and $R_5$ are a hydrogen atom, the other one is not a hydrogen atom or a methyl group; and a pH is 5.0 or less.

DESCRIPTION OF EMBODIMENTS

Hereinafter, the present invention will be described. Incidentally, the present invention is not limited only to the following embodiments. In addition, unless otherwise noted, operations, physical properties, and the like were measured under conditions of room temperature (20 to 25° C.)/relative humidity of 40 to 50% RH.

(Polishing Composition)

The present invention is to provide a polishing composition for use in polishing an object to be polished which contains abrasive grains, a dispersing medium, and an additive, wherein the abrasive grains are surface-modified, the additive is represented by the following formula 1:

[Chemical Formula 2]

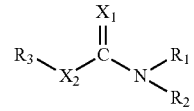

(Formula 1)

wherein in the formula 1, $X_1$ is O or $NR_4$, $X_2$ is a single bond or $NR_5$, $R_1$ to $R_5$ are each independently a hydrogen atom; a hydroxy group; a nitro group; a nitroso group; a $C_{1-4}$ alkyl group optionally substituted with a carboxyl group, an amino group, or a hydroxy group; or $CONH_2$; with the proviso that $R_2$ and $R_5$ may form a ring; when $X_2$ is a single bond, $R_3$ is not a hydrogen atom, or $R_1$ to $R_3$ are not methyl groups; and when $X_2$ is $NR_5$, and three of $R_1$ to $R_3$ and $R_5$ are hydrogen atoms, the other one is not a hydrogen atom or a methyl group; and a pH is 5.0 or less. By such configuration, it is possible to polish not only polycrystalline silicon but also a silicon nitride film at high speed and also to suppress a polishing speed of a silicon oxide film. Thus, according to the present invention, it is possible to provide a polishing composition capable of polishing not only polycrystalline silicon but also a silicon nitride film at high speed and also suppressing a polishing speed of a silicon oxide film.

In an acidic region, a polishing speed of polycrystalline silicon usually decreases. However, surprisingly, in the present invention, by adding an additive having a specific structure, not only a silicon nitride film but also polycrystalline silicon can be polished at high speed.

(Abrasive Grains)

In the present invention, the abrasive grains are surface-modified (also referred to as "surface-modified abrasive grains" herein). According to a preferred mode of the present invention, the surface-modified abrasive grains have an organic acid immobilized on a surface of abrasive grains. In the present invention, when the surface-modified abrasive grains are not used as abrasive grains, the desired effects of the present invention cannot be attained.

Examples of materials forming the abrasive grains include metal oxides, such as silica, alumina, zirconia, and titania. These abrasive grains may be used alone, and it is also possible to use a combination of two or more kinds. As the material of abrasive grains, silica is preferable.

Silica having an organic acid immobilized on a surface thereof is preferably silica having an organic acid chemically bonded to the surface thereof. Examples of such silica include fumed silica, colloidal silica, and the like, and colloidal silica is particularly preferable. The organic acid is not particularly limited, and examples thereof include sulfonic acid, carboxylic acid, phosphoric acid, and the like. Sulfonic acid or carboxylic acid is preferable. Incidentally, the silica having an organic acid immobilized on a surface thereof has an acidic group derived from the organic acid (e.g., a sulfo group, a carboxyl group, a phosphoric acid group, etc.) immobilized via a covalent bond (in some cases, through a linker structure) on a surface of silica. Here, the linker structure is referred to an arbitrary structure that is present between a surface of silica and an organic acid. Therefore, the silica having an organic acid immobilized on a surface thereof may have an acidic group derived from an organic acid by a covalent bond directly or by a covalent bond through a linker structure immobilized on a surface of silica.

A method for introducing the organic acid onto a surface of silica is not particularly limited, and may be a method which comprises introducing a compound having a sulfhydryl group, an alkyl group, or the like onto a surface of silica, and then oxidizing the group to sulfonic acid, carboxylic acid, or a method which comprises introducing a compound having a protective group bonded to the organic acid group onto a surface of silica, and then releasing the protective group. In addition, the compound used for introducing an organic acid onto the silica surface has at least one functional group that can be converted to an organic acid group, and preferably further contains a functional group used for bonding with a hydroxyl group on a silica surface, a functional group introduced in order to control hydrophobicity/hydrophilicity, a functional group introduced in order to control steric bulk, and the like.

As a specific method for synthesizing silica having an organic acid immobilized on a surface thereof, in the case where sulfonic acid, as an organic acid, is immobilized on a surface of silica, for example, the method described in "Sulfonic acid-functionalized silica through quantitative oxidation of thiol groups", Chem., Commun., 246-247 (2003), can be employed.

Specifically, silica having sulfonic acid immobilized on a surface thereof can be obtained by coupling a silane coupling agent having a thiol group such as 3-mercaptopropyltrimethoxysilane to silica, and then oxidizing the thiol group with hydrogen peroxide. The sulfonic acid-immobilized colloidal silica in the Example of the present invention is also produced in the same manner.

In the case where carboxylic acid is immobilized on a surface of silica, for example, the method described in "Novel Silane Coupling Agents Containing a Photo labile 2-Nitrobenzyl Ester for Introduction of a Carboxy Group on the Surface of Silica Gel", Chemistry Letters, 3, 228-229 (2000), can be employed. Specifically, silica having carboxylic acid immobilized on a surface thereof can be obtained by coupling a silane coupling agent containing photoreactive 2-nitrobenzyl ester to silica, followed by irradiation with light. According to a preferred embodiment of the present invention, the surface-modified abrasive grains are sulfonic acid-immobilized silica. According to the embodiment, it is possible to polish not only polycrystalline silicon but also a silicon nitride film at high speed and also suppress the polishing speed of a silicon oxide film.

In the polishing composition of the present invention, the lower limit of an average primary particle size of the surface-modified abrasive grains is preferably 5 nm or more, more preferably 7 nm or more, and still more preferably 10 nm or more. With such a particle size, an effective polishing speed can be obtained. In addition, in the polishing composition of the present invention, the upper limit of the average primary particle size of the surface-modified abrasive grains is preferably 60 nm or less, more preferably 40 nm or less, and still more preferably 25 nm or less. With such a particle size, such performance as of erosion, recess, and the like can be well controlled. Incidentally, the average primary particle size of the surface-modified abrasive grains can be calculated, for example, based on a specific surface area of the surface-modified abrasive grains measured by a BET method. Also in the Examples of the present invention, measurement is performed in such a manner.

In the polishing composition of the present invention, the lower limit of an average secondary particle size of the surface-modified abrasive grains is preferably 15 nm or more, more preferably 18 nm or more, and still more preferably 26 nm or more. With such a particle size, an effective polishing speed can be obtained. In addition, the upper limit of the average secondary particle size of the surface-modified abrasive grains is preferably 90 nm or less, more preferably 70 nm or less, and still more preferably 50 nm or less. Within such a range, with such a particle size, the number of defects can be well controlled. Incidentally, the "secondary particles" as used herein refers to a particle formed by gathering surface-modified abrasive grains in the polishing composition. The average secondary particle size of the secondary particles can be measured by a dynamic light scattering method, such as a laser diffraction/scattering method, for example. Also in the Examples of the present invention, measurement is performed in such a manner.

In a particle size distribution of the surface-modified abrasive grains in the polishing composition of the present invention determined by the laser diffraction/scattering method, the lower limit of a ratio of a particle diameter D90 when a particle mass integrated from a fine particle side reaches 90% of an entire particle mass to a particle diameter D10 when it reaches 10% of the entire particle mass (also simply referred to as "D90/D10" herein) is preferably 1.3 or more, more preferably 1.4 or more, and still more preferably 1.5 or more. With such a ratio, an effective polishing speed can be obtained. In addition, the upper limit of D90/D10 is not particularly set, but is preferably 5.0 or less, more preferably 4.0 or less, and still more preferably 3.0 or less. With such a ratio, roughness (surface roughness of an object to be polished) can be improved.

In the polishing composition of the present invention, the lower limit of a content of the surface-modified abrasive grains is preferably 0.01 mass % or more, more preferably 0.05 mass % or more, still more preferable 0.1 mass % or more, and yet more preferably 1.0 mass % or more. With such a content, an effective polishing speed can be obtained. In addition, in the polishing composition of the present invention, the upper limit of the content of the surface-modified abrasive grains is preferably 20 mass % or less, more preferably 10 mass % or less, and still more preferably 5 mass % or less. With such a content, there is an economical advantage.

(Dispersing Medium)

In the polishing composition of the present invention, a dispersing medium is used for dispersing each of components that form the polishing composition. As a dispersing medium, an organic solvent and water are possible. Among them, the polishing composition preferably contains water.

In terms of inhibiting contamination of an object to be polished or action of other components, water containing as little impurities as possible is preferable. Specifically, pure water and ultrapure water obtained by removing impurity ions with an ion exchange resin and then removing foreign bodies through a filter, and distilled water are preferable.

(Additive)

In the present invention, the polishing composition contains an additive represented by the following formula 1:

[Chemical Formula 3]

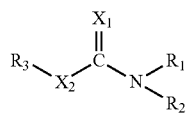

(Formula 1)

wherein in the formula 1, $X_1$ is O or $NR_4$, $X_2$ is a single bond or $NR_5$, $R_1$ to $R_5$ are each independently a hydrogen atom; a hydroxy group; a nitro group; a nitroso group; a $C_{1-4}$ alkyl group optionally substituted with a carboxyl group, an amino group, or a hydroxy group; or $CONH_2$; with the proviso that $R_2$ and $R_5$ may form a ring; when $X_2$ is a single bond, $R_3$ is not a hydrogen atom, or $R_1$ to $R_3$ are not methyl groups; and when $X_2$ is $NR_5$ and three of $R_1$ to $R_3$ and $R_5$ are hydrogen atoms, the other one is not a hydrogen atom or a methyl group. By this, it is possible to polish not only polycrystalline silicon but also a silicon nitride film at high speed and also suppress the polishing speed of a silicon oxide film.

The mechanism that the desired effects of the present invention can be attained by adding the additive having a specific structure as above to a polishing composition is not clear, but is presumably as follows. Needless to say, the technical scope of the present invention is not limited by this mechanism.

That is, the additive is adsorbed to a polycrystalline silicon film with a moderate force, and the adsorbed portion embrittles Si—Si interatomic bond of the polycrystalline silicon film. The adsorption and the chemical reaction with the polycrystalline silicon film contribute to the improvement of polishing speed. The above embrittlement is not often seen in a silicon nitride film or a silicon oxide film. However, when the pH is made 5.0 or less, polishing speed of a silicon nitride film can be increased, and, due to their synergistic effects, not only polycrystalline silicon but also a silicon nitride film can be polished at high speed. Within the pH range in the present invention, in the absence of the additive, a polycrystalline silicon film is hydrophobic, a silicon nitride film is hydrophilic, and a silicon oxide film is hydrophilic. However, by adding the additive, a polycrystalline silicon film can be hydrophilized. Generally, load on a polishing pad during polishing is different between a hydrophilic film and a hydrophobic film, and defects are likely to occur on their boundary. The additive also can play a role of preventing such defects.

Incidentally, the additive of the present invention may be in the form of a salt. Examples of preferred salts include phosphates, alkyl hydrochlorides (the number of carbon atoms in alkyl is 1 to 4), hydrochlorides, sulfates, and acetates, preferably phosphates and alkyl hydrochlorides (the number of carbon atoms in alkyl is 1 to 4), and still more preferably phosphates and methyl hydrochloride. The reason for this is presumably that donation of electrons by phosphorus of phosphate, chlorine of hydrochloride, sulfur of sulfate, or the like and action of oxygen double bond moiety or the like in the additive on a polycrystalline silicon film such work in cooperation to promote the chemical reaction.

In the formula 1, $C_{1-4}$ alkyl groups as $R_1$ to $R_5$ may be linear or branched. Preferred examples thereof include a methyl group, an ethyl group, an n-propyl group, an isopropyl group, an n-butyl group, an isobutyl group, a sec-butyl group, a tert-butyl group, and the like. When the number of carbon atoms is 5 or more, the desired effects of the present invention are not produced. The reason for this is that steric hindrance of the alkyl group would become large and does not effectively react with an object to be polished, and thus polishing speed does not increase. In addition, when an alkyl moiety is large, the solubility is poor, and in the case using colloidal silica as the abrasive grains, stability of the colloidal silica is also poor.

$R_4$ in $NR_4$ is a hydrogen atom; a hydroxy group; a nitro group; a nitroso group; a $C_{1-4}$ alkyl group optionally substituted with a carboxyl group, an amino group, or a hydroxy group; or $CONH_2$, preferably a hydrogen atom or a $C_{1-4}$ alkyl group optionally substituted with a carboxyl group, an amino group, or a hydroxy group, and more preferably a hydrogen atom or an unsubstituted $C_{1-4}$ alkyl group.

$R_5$ in $NR_5$ is a hydrogen atom; a hydroxy group; a nitro group; a nitroso group; a $C_{1-4}$ alkyl group optionally substituted with a carboxyl group, an amino group, or a hydroxy group; or $CONH_2$, and preferably a hydrogen atom, a $C_{1-4}$ alkyl group optionally substituted with a carboxyl group, or $CONH_2$. $R_2$ and $R_5$ optionally form a ring, and preferably form a 5 to 7-membered ring. Incidentally, to "optionally form a ring" means that $R_2$ and $R_5$ may be joined together to form a ring structure (heterocyclic structure) containing at least a nitrogen atom.

According to a preferred embodiment of the present invention, $X_1$ is O, $X_2$ is $NR_5$, and two or more of $R_1$ to $R_3$ and $R_5$ are $C_{1-4}$ alkyl groups optionally substituted with a carboxyl group, an amino group, or a hydroxy group. In addition, in the case where one to three of $R_1$ to $R_3$ and $R_5$, preferably two to three of $R_1$ to $R_3$ and $R_5$, are $C_{1-4}$ alkyl groups optionally substituted with a carboxyl group, an amino group, or a hydroxy group, it is preferable that other(s) are hydrogen atom(s). Further, according to a still more preferred embodiment of the present invention, $X_1$ is O, $X_2$ is $NR_5$, and $R_1$ to $R_3$ and $R_5$ are all $C_{1-4}$ alkyl groups optionally substituted with a carboxyl group, an amino group, or a hydroxy group.

In addition, according to a preferred embodiment of the present invention, $X_1$ is NH, $X_2$ is $NR_5$, and $R_1$ to $R_3$ and $R_5$ are each independently a hydrogen atom; a $C_{1-4}$ alkyl group optionally substituted with a carboxyl group, an amino group, or a hydroxy group; or —$CONH_2$. Further, according to a more preferred embodiment of the present invention, $X_1$ is NH, $X_2$ is $NR_5$, and $R_1$ to $R_3$ and $R_5$ are each independently a hydrogen atom; or a $C_{1-4}$ alkyl group optionally substituted with a carboxyl group, an amino group, or a hydroxy group.

In addition, according to a preferred embodiment of the present invention, $X_2$ is a single bond, and $R_1$ to $R_3$ are each independently a hydrogen atom or a $C_{1-4}$ alkyl group optionally substituted with a carboxyl group, an amino group, or a hydroxy group. Further, according to a more preferred mode of the present invention, $X_2$ is a single bond and $R_1$ to $R_3$ are each independently a hydrogen atom or a $C_{1-4}$ alkyl group.

In addition, according to a preferred embodiment of the present invention, $X_1$ is O or NH, $X_2$ is a single bond or $NR_5$, and $R_1$ to $R_3$ and $R_5$ are each independently a hydrogen atom or a $C_{1-4}$ alkyl group optionally substituted with a carboxyl group.

In addition, according to a preferred embodiment of the present invention, $X_1$ is O, $R_2$ and $R_5$ form a ring, and $R_1$ and $R_3$ are each independently a hydrogen atom or a $C_{1-4}$ alkyl group optionally substituted with a carboxyl group, an amino group, or a hydroxy group.

In addition, as preferred examples of the additives of the present invention, tetramethylurea, 1,3-dimethyl-2-imidazolidinone, 1,3-dimethyl-3,4,5,6-tetrahydro-2 (1H)-pyrimidinone, 1,3-dimethylurea, 1,1,3,3-tetraethyl urea, guanylurea phosphate, dimethylisobutyramide, 1,1-diethylurea, N-ethylacetamide, creatine hydrate, N-acetylethylenediamine, and 2-acetamidoethanol are cited, and as more preferred additives, tetramethylurea, 1,3-dimethyl-2-imidazolidinone, dimethylisobutyramide, and creatine hydrate are cited.

In the polishing composition of the present invention, the lower limit of a concentration of the additive is preferably 1 g/L or more, more preferably 3 g/L or more, still more preferably 4 g/L or more, and yet more preferably 5 g/L or more. With such a concentration, the desired effects of the present invention can be efficiently produced. In addition, in the polishing composition of the present invention, the upper limit of the concentration of the additive is preferably 20 g/L or less, more preferably 10 g/L or less, still more preferably 8 g/L or less, and yet more preferably 7 g/L or less. With such a concentration, the desired effects of the present invention can be efficiently produced.

(pH Adjusting Agent)

In the present invention, the pH of the polishing composition is 5.0 or less. When the pH is more than 5.0, the desired effects of the present invention cannot be produced. In the present invention, the pH of the polishing composition should be 5.0 or less, but is preferably 4.6 or less, and more preferably 4.3 or less. The desired effects of the present invention can be efficiently produced. In addition, the lower limit thereof is not particularly set, but is preferably 2.0 or more, more preferably 3.0 or more, and still more preferably 3.5 or more. The reason for this is that when the pH is 2.0 or more, polishing speed of an object to be polished (particularly polysilicon) increases.

As specific examples of a pH adjusting agent for adjusting to an acidic region, any of inorganic compounds and organic compounds may be applicable. Examples thereof include inorganic acids such as sulfuric acid, nitric acid, boric acid, carbonic acid, phosphinic acid, phosphorous acid, and phosphoric acid; organic acids such as carboxylic acids including citric acid, formic acid, acetic acid, propionic acid, benzoic acid, salicylic acid, glyceric acid, oxalic acid, malonic acid, succinic acid, maleic acid, phthalic acid, malic acid, tartaric acid, lactic acid, etc., and organic sulfuric acids including methanesulfonic acid, ethanesulfonic acid, isethionic acid, etc., and the like. In addition, of the above acids, a divalent or higher acid (e.g., sulfuric acid, carbonic acid, phosphoric acid, oxalic acid, etc.) may be in the form of a salt, as long as at least one proton ($H^+$) can be discharged. Specific examples thereof include ammonium hydrogen carbonate and ammonium hydrogen phosphate (an countercation thereof is basically not limited, but cations of a weak base (ammonium, triethanolamine, etc.) are preferable). Incidentally, in order to adjust the pH that has decreased too much, a pH adjusting agent for adjusting to a basic region may also be added.

(Object to be Polished)

As silicon nitride films, SiN (silicon nitride), SiCN (silicon nitrocarbide), and the like can be mentioned. A typical example of polycrystalline silicon is polysilicon. As silicon oxide films, TEOS, silicon oxide containing a methyl group, fluorinated silicon oxide (SiOF), and the like can be mentioned.

(Method for Producing Polishing Composition)

A method for producing the polishing composition of the present invention is not limited as long as the method includes mixing the abrasive grains, the dispersing medium, and the additive, and is capable of producing a polishing composition in which the pH (of the polishing composition) is 5.0 or less. For example, the polishing composition can be obtained by stirring and mixing the abrasive grains and the additive, together with another optional component(s), in the dispersing medium.

As specific descriptions of the abrasive grains, the dispersing medium, and the additive, the above descriptions can be similarly applied. In addition, as another optional component(s), components such as a pH adjusting agent, an oxidizing agent, a reducing agent, a surfactant, a water-soluble polymer, and an antifungal agent can be mentioned. an order of the addition of the above components and an addition method are not particularly limited. The above components may be added at once or separately, in stages or continuously. In addition, a mixing method is not particularly limited either, and a known method may be used. A temperature at the time of mixing the components is not particularly limited, but is preferably 10° C. to 40° C., and heating may be performed in order to increase a rate of dissolution. In addition, a mixing time is not particularly limited either, and is preferably 5 to 60 minutes, more preferably 10 to 30 minutes, for example. In addition, the method for producing a polishing composition may further include measuring a pH of the polishing composition and adjusting the pH 5 or less.

(Polishing Method)

The present invention also provides a polishing method including polishing an object to be polished using the polishing composition described above or using a polishing composition obtained by the method described above.

As a polishing device, a common polishing device having attached thereto a holder for holding a substrate having the object to be polished or the like, a motor capable of changing a rotation speed, and the like, and including a polishing table to which a polishing pad (polishing cloth) can be attached, may be used.

As the polishing pad, common nonwoven fabrics, polyurethane, porous fluororesin, and the like may be used without particular limitations. The polishing pad is preferably grooved so as to retain the polishing composition.

Polishing conditions are not particularly limited. For example, a rotation speed of a polishing table is preferably 10 to 500 rpm, a carrier rotation speed is preferably 10 to 500 rpm, and a pressure applied to a substrate having an object to be polished (polishing pressure) is preferably 0.1 to 10 psi. A method for supplying a polishing composition to a polishing pad is not particularly limited, and a continuous supply method using a pump or the like may be employed, for example. A supply amount is not limited, but it is preferable such an amount as that a surface of polishing pad is constantly covered with the polishing composition of the present invention.

(Method for Improving Polishing Speed of Polycrystalline Silicon and Silicon Nitride Film and Suppressing Polishing Speed of Silicon Oxide Film)

The present invention also provides a method for improving polishing speed of polycrystalline silicon and a silicon nitride film and also suppressing polishing speed of a silicon oxide film, including polishing using the polishing composition. As specific descriptions of the polishing composition, the above descriptions can be similarly applied.

(Polishing Speed)

In the present invention, a polishing speed (Å/min) of polysilicon, a polishing speed (Å/min) of SiN (silicon nitride film), and a polishing speed (Å/min) of TEOS (silicon oxide film) are preferably 500 (Å/min) or more, 300 (Å/min) or more, and 100 (Å/min) or less, respectively. More preferably, they are 980 (Å/min) or more, 370 (Å/min) or more, and 35 (Å/min) or less, respectively. Incidentally, the above polishing speeds are each a value measured by the method described in the Examples.

(Selection Ratio)

When a value obtained by dividing a polishing speed (Å/min) of SiN (silicon nitride film) by a polishing speed (Å/min) of TEOS (silicon oxide film), a value obtained by dividing a polishing speed (Å/min) of polysilicon by a polishing speed (Å/min) of TEOS (silicon oxide film), and a value obtained by dividing a polishing speed (Å/min) of polysilicon by a polishing speed (Å/min) of SiN (silicon nitride film) are calculated as a selection ratio, the selection ratio (SiN/TEOS), the selection ratio (Poly-Si/TEOS), and the selection ratio (Poly-Si/SiN) are preferably 5.0 or more, 3.0 or more, and 4.0 or less, respectively, in the present invention, and more preferably 10 or more, 25 or more, and 2.10 or less, respectively. Incidentally, the above selection ratios are values determined based on the polishing speeds measured by the method described in the Examples.

EXAMPLES

The present invention will be described in more detail using the following examples and comparative examples. However, the technical scope of the present invention is not limited only to the following examples. In addition, in the following Examples, unless otherwise noted, operations were performed under conditions of room temperature (25° C.)/relative humidity 40 to 50% RH.

<Production of Polishing Composition>

Example 1

A polishing composition was prepared by mixing abrasive grains (sulfonic acid-immobilized colloidal silica; average primary particle size: about 14 nm, average secondary particle size: about 32 nm, D90/D10: about 2.0); sulfuric acid as a pH adjusting agent; and tetramethylurea as an additive; in a dispersing medium (pure water) in such a manner that a concentration of abrasive grains was 3.0% by mass, a concentration of tetramethylurea was 6.00 g/L, and the pH was 4.0 (mixing temperature: about 25° C., mixing time: about 10 minutes). Incidentally, an average secondary particle size of abrasive grains of Examples 7, 16, and 17 is about 67 nm.

An average primary particle size of abrasive grains was calculated from a specific surface area of abrasive grains measured by a BET method using "Flow Sorb II 2300" manufactured by Micromeritics, and a density of abrasive grains.

In addition, pH of a polishing composition (liquid temperature: 25° C.) was checked with a pH meter (manufactured by HORIBA, Ltd., Model No.: LAQUA).

In addition, electrical conductivity ([mS/cm]) of a polishing composition (liquid temperature: 25° C.) was measured using an electrical conductivity meter manufactured by HORIBA Co., Ltd.

Examples 2 to 17, Comparative Examples 1 to 16

A polishing composition was prepared in the same manner as in Example 1, except that an average primary particle size of abrasive grains, a concentration of abrasive grain, a kind of additive, a concentration of additive, a pH adjusting agent, and pH were changed as shown in Table 1.

<Polishing Performance Evaluation>

As an object to be polished,
a 200-mm wafer (Poly-Si (polysilicon)),
a 200-mm wafer (SiN (silicon nitride film)), and
a 200-mm wafer (TEOS (silicon oxide film)) were prepared. By using the polishing composition obtained above, each wafer was polished under the following polishing conditions, and a polishing speed was measured. In addition, selection ratios were calculated.

(Polishing Conditions)

Polishing machine: CMP one-side polishing machine for 200-mm wafer
Polishing pad: Pad made of polyurethane (IC 1010: manufactured by Rohm & Haas)
Pressure: 3 psi (about 20.7 kPa)
Platen (surface plate) rotation speed: 90 rpm
Head (carrier) rotation speed: 87 rpm
Flow rate of polishing composition: 130 ml/min
Polishing time: 1 minute (Polishing Speed)

A polishing speed (polishing rate) was calculated by the following equation.

[Equation 1]

$$\text{Polishing rate [Å/min]} = \frac{\text{Thickness of film before polishing [Å]} - \text{Thickness of film after polishing [Å]}}{\text{Polishing time [min]}}$$

A film thickness was determined using a light interference type film thickness measurement apparatus (manufactured by KLA-Tencor, Model No.: ASET), and a difference therebetween was divided by a polishing time for evaluation. The results are shown in Table 1.

TABLE 1

| Examples/ Comparative Examples | Average primary particle size of abrasive grains | Modification | Concentration of abrasive grain (% by mass) | pH | E.C. [mS/cm] | pH Adjusting agent | Kind of additive |
|---|---|---|---|---|---|---|---|
| Example 1 | About 14 nm | Modified with sulfonic acid | 3.0 | 4.0 | 0.202 | Sulfuric acid | Tetramethylurea |
| Example 2 | About 14 nm | Modified with sulfonic acid | 3.0 | 4.1 | 0.392 | Sulfuric acid | 1,3-Dimethyl-2-imidazolidinone |

TABLE 1-continued

| | | | | | | | |
|---|---|---|---|---|---|---|---|
| Example 3 | About 14 nm | Modified with sulfonic acid | 3.0 | 4.1 | 0.392 | Maleic acid | 1,3-Dimethyl-3,4,5,6-tetrahydro-2(1H)-pyrimidinone |
| Example 4 | About 14 nm | Modified with sulfonic acid | 3.0 | 4.1 | 0.392 | Sulfuric acid | 1,3-Dimethylurea |
| Example 5 | About 14 nm | Modified with sulfonic acid | 3.0 | 4.1 | 0.392 | Sulfuric acid | 1,1,3,3-Tetraethylurea |
| Example 6 | About 14 nm | Modified with sulfonic acid | 3.0 | 4.0 | 1.95 | Sulfuric acid | Guanylurea phosphate |
| Example 7 | About 32 nm | Modified with sulfonic acid | 3.0 | 4.0 | 1.95 | Sulfuric acid | Guanylurea phosphate |
| Example 8 | About 14 nm | Modified with sulfonic acid | 3.0 | 3.9 | 0.228 | Sulfuric acid | DMIB Dimethylisobutyramide |
| Example 9 | About 14 nm | Modified with sulfonic acid | 3.0 | 3.9 | 0.216 | Sulfuric acid | 1,1-Diethylurea |
| Example 10 | About 14 nm | Modified with sulfonic acid | 3.0 | 4.0 | 0.22 | Isethionic acid | N-Ethylacetamide |
| Example 11 | About 14 nm | Modified with sulfonic acid | 3.0 | 4.0 | 0.395 | Sulfuric acid | Creatine hydrate |
| Example 12 | About 14 nm | Modified with sulfonic acid | 3.0 | 3.8 | 3.45 | Sulfuric acid | N-Acetylethylenediamine |
| Example 13 | About 14 nm | Modified with sulfonic acid | 3.0 | 4.1 | 0.392 | Sulfuric acid | 2-Acetamidoethanol |
| Example 14 | About 14 nm | Modified with sulfonic acid | 1.5 | 4.0 | 0.125 | Maleic acid | Tetramethylurea |
| Example 15 | About 14 nm | Modified with sulfonic acid | 6.0 | 4.0 | 0.441 | Maleic acid | Tetramethylurea |
| Example 16 | About 32 nm | Modified with sulfonic acid | 3.0 | 3.9 | 0.1625 | Sulfuric acid | Tetramethylurea |
| Example 17 | About 32 nm | Modified with sulfonic acid | 3.0 | 3.9 | 0.1625 | Sulfuric acid | 1,3-Dimethyl-3,4,5,6-tetrahydro-2(1H)-pyrimidinone |
| Comparative Example 1 | About 14 nm | Modified with sulfonic acid | 3.0 | 4.0 | 0.23 | Sulfuric acid | Urea |
| Comparative Example 2 | About 14 nm | Modified with sulfonic acid | 3.0 | 4.1 | 0.26 | Sulfuric acid | Methyl carbamate |
| Comparative Example 3 | About 14 nm | Modified with sulfonic acid | 3.0 | 4.0 | 0.22 | Sulfuric acid | Acetamido aminoethane sulfonic acid |
| Comparative Example 4 | About 14 nm | Modified with sulfonic acid | 3.0 | 4.0 | 0.22 | Sulfuric acid | N-Methylformamide |
| Comparative Example 5 | About 14 nm | Modified with sulfonic acid | 3.0 | 4.0 | 0.25 | Sulfuric acid | D-Panthenol |
| Comparative Example 6 | About 14 nm | Modified with sulfonic acid | 3.0 | 4.0 | 0.366 | Sulfuric acid | 1-Methylurea |
| Comparative Example 7 | About 14 nm | Modified with sulfonic acid | 3.0 | 4.1 | 0.392 | Sulfuric acid | Glycine methyl hydrochloride |
| Comparative Example 8 | About 14 nm | Modified with sulfonic acid | 3.0 | 4.1 | 0.392 | Sulfuric acid | Benzene sulfonamide |
| Comparative Example 9 | About 32 nm | Modified with sulfonic acid | 3.0 | 3.9 | 0.1625 | Sulfuric acid | 1-Methyl-2-pyrrolidone |
| Comparative Example 10 | About 32 nm | Not modified | 3.0 | 3.9 | 0.1625 | Sulfuric acid | 1-Methyl-2-pyrrolidone |
| Comparative Example 11 | About 32 nm | Modified with sulfonic acid | 3.0 | 3.9 | 0.1625 | Sulfuric acid | Pyrazole |
| Comparative Example 12 | About 90 nm | Modified with sulfonic acid | 10.0 | 4.0 | 3.75 | Maleic acid | Not added |
| Comparative Example 13 | About 14 nm | Modified with sulfonic acid | 3.0 | 7.0 | 0.202 | Sulfuric acid | Tetramethylurea |
| Comparative Example 14 | About 14 nm | Modified with sulfonic acid | 3.0 | 10.0 | 0.202 | Sulfuric acid | Tetramethylurea |
| Comparative Example 15 | About 32 nm | Not modified | 3.0 | 4.0 | 1.95 | Sulfuric acid | Guanylurea phosphate |
| Comparative Example 16 | About 90 nm | Not modified | 3.0 | 4.0 | 1.95 | Sulfuric acid | Guanylurea phosphate |

| Examples/ Comparative Examples | Concentration of additive | Polishing speed | | | Selection ratio | | |
|---|---|---|---|---|---|---|---|
| | | Poly-Si | SiN | TEOS | SiN/TEOS | Poly-Si/TEOS | Poly-Si/SiN |
| Example 1 | 6.00 [g/L] | 1521 | 402 | 33 | 12.02 | 45.45 | 3.78 |
| Example 2 | 6.00 [g/L] | 1410 | 393 | 35 | 11.30 | 40.55 | 3.59 |
| Example 3 | 6.00 [g/L] | 1071 | 416 | 76 | 5.48 | 14.11 | 2.57 |
| Example 4 | 6.00 [g/L] | 1065 | 388 | 57 | 6.81 | 18.71 | 2.75 |
| Example 5 | 6.00 [g/L] | 803 | 417 | 49 | 8.46 | 16.29 | 1.93 |

TABLE 1-continued

| | | | | | | | |
|---|---|---|---|---|---|---|---|
| Example 6 | 6.00 [g/L] | 746 | 399 | 78 | 5.10 | 9.52 | 1.87 |
| Example 7 | 6.00 [g/L] | 587 | 425 | 67 | 6.37 | 8.81 | 1.38 |
| Example 8 | 6.00 [g/L] | 988 | 483 | 33 | 14.44 | 29.55 | 2.05 |
| Example 9 | 6.00 [g/L] | 1015 | 335 | 37 | 9.05 | 27.43 | 3.03 |
| Example 10 | 6.00 [g/L] | 957 | 345 | 23 | 15 | 40.76 | 2.77 |
| Example 11 | 6.00 [g/L] | 1384 | 378 | 25 | 14.82 | 54.30 | 3.66 |
| Example 12 | 6.00 [g/L] | 534 | 407 | 70 | 5.81 | 7.62 | 1.31 |
| Example 13 | 6.00 [g/L] | 670 | 401 | 36 | 11.37 | 18.61 | 1.67 |
| Example 14 | 6.00 [g/L] | 983 | 386 | 14 | 27.32 | 69.62 | 2.55 |
| Example 15 | 6.00 [g/L] | 1342 | 453 | 23 | 19.44 | 57.53 | 2.96 |
| Example 16 | 6.00 [g/L] | 1198 | 356 | 22 | 16.38 | 55.06 | 3.36 |
| Example 17 | 6.00 [g/L] | 751 | 302 | 13 | 22.86 | 56.91 | 2.49 |
| Comparative Example 1 | 6.00 [g/L] | 224 | 400 | 26 | 15.11 | 8.47 | 0.56 |
| Comparative Example 2 | 2.50 [g/L] | 328 | 349 | 28 | 12.60 | 11.86 | 0.94 |
| Comparative Example 3 | 2.50 [g/L] | 238 | 370 | 22 | 17.07 | 10.97 | 0.64 |
| Comparative Example 4 | 6.00 [g/L] | 36 | 374 | 20 | 19.11 | 1.87 | 0.10 |
| Comparative Example 5 | 6.00 [g/L] | 117 | 367 | 21 | 17.14 | 5.44 | 0.32 |
| Comparative Example 6 | 6.00 [g/L] | 328 | 379 | 27 | 13.85 | 11.99 | 0.87 |
| Comparative Example 7 | 6.00 [g/L] | 353 | 412 | 117 | 3.52 | 3.02 | 0.86 |
| Comparative Example 8 | 6.00 [g/L] | 107 | 403 | 91 | 4.42 | 1.17 | 0.27 |
| Comparative Example 9 | 6.00 [g/L] | 1338 | 209 | 20 | 10.38 | 66.49 | 6.41 |
| Comparative Example 10 | 6.00 [g/L] | 1054 | 232 | 29 | 8.05 | 36.55 | 4.54 |
| Comparative Example 11 | 6.00 [g/L] | 868 | 213 | 14 | 14.90 | 60.78 | 4.08 |
| Comparative Example 12 | — | 94 | 249 | 86 | 2.88 | 1.09 | 0.38 |
| Comparative Example 13 | 6.00 [g/L] | 1667 | 139 | 25 | 5.55 | 66.53 | 11.99 |
| Comparative Example 14 | 6.00 [g/L] | 2429 | 65 | 30 | 2.17 | 80.78 | 37.25 |
| Comparative Example 15 | 6.00 [g/L] | 396 | 221 | 59 | 3.75 | 6.72 | 1.79 |
| Comparative Example 16 | 6.00 [g/L] | 197 | 168 | 183 | 0.92 | 1.08 | 1.17 |

DISCUSSION

It is noted from the above results that according to the polishing composition of the present invention, not only polycrystalline silicon, while a silicon nitride film can be polished at high speed and also polishing speed of a silicon oxide film can be suppressed. As described above, it is more preferable that a polishing speed (Å/min) of polysilicon, a polishing speed (Å/min) of SiN (silicon nitride film), and a polishing speed (Å/min) of TEOS (silicon oxide film) are 980 (Å/min) or more, 370 (Å/min) or more, and 35 (Å/min) or less respectively, and a selection ratio (SiN/TEOS), a selection ratio (Poly-Si/TEOS), and a selection ratio (Poly-Si/SiN) are 10 or more, 25 or more, and 2.10 or less, respectively. Tetramethylurea (Examples 1, 14 to 16), 1,3-dimethyl-2-imidazolidinone (Example 2), dimethylisobutyr-amide (Example 8), and creatine hydrate (Example 11) satisfy these preferred properties in a well-balanced manner, suggesting that they are particularly preferable.

On the other hand, the polishing compositions of the Comparative Examples were not capable of polishing at least either of polycrystalline silicon and a silicon nitride film at high speed, and further, depending on the composition, it is not possible to suppress polishing speed of a silicon oxide film. More specifically, the additives of Comparative Examples 1 to 11 do not have the specific structure of the present invention, and thus cannot achieve the desired effects of the present invention. In addition, in Comparative Example 12 where no additive was added, polishing speeds of polycrystalline silicon and a silicon nitride film are both low. In Comparative Examples 13 and 14, although an additive having the specific structure of the present invention is added, because the pH is more than 5.0, the desired effects of the present invention cannot be achieved. Also in Comparative Examples 15 and 16, although an additive having the specific structure of the present invention is added, because the abrasive grains are not surface-modified, the desired effects of the present invention cannot be achieved.

As mentioned above, in examining application of CMP to various steps in semiconductor manufacturing, the present inventors have found that it is sometimes preferable in manufacturing that not only polycrystalline silicon but also a silicon nitride film are polished at high speed. With respect to a silicon oxide film, they have found that it is sometimes preferable in manufacturing that polishing speed is made as low as possible. It can be said that the present invention is a revolutionary one in that it could solve such unknown problems.

In addition, generally, with an increase in demands, it becomes more difficult to provide a means to satisfy all demands. However, the present invention can meet a large number of demands, that is, polishing not only polycrystalline silicon (1) but also a silicon nitride film (2) at high speed, and also suppressing polishing speed of a silicon oxide film (3), which can be called a breakthrough in this respect.

This application is based on Japanese Patent Application No. 2017-002695 filed on Jan. 11, 2017, the contents of which are entirely incorporated herein by reference.

The invention claimed is:

1. A polishing composition for use in polishing an object to be polished, which comprises abrasive grains, a dispersing medium, and an additive,
   wherein the abrasive grains are surface-modified,
   the additive is represented by the following formula 1:

[Chemical Formula 1]

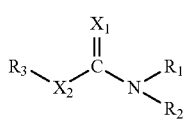

(Formula 1)

wherein in the formula 1,
   $X_1$ is O,
   $X_2$ is $NR_5$, and
   two or more of $R_1$ to $R_3$ and $R_5$ are a $C_{1-4}$ alkyl group optionally substituted with a carboxyl group, an amino group, or a hydroxy group and one or more of $R_1$ to $R_3$ and $R_5$ is a hydrogen atom and when $R_1$ and $R_2$ are a hydrogen atom or $R_3$ and $R_5$ are a hydrogen atom, one or more of the $C_{1-4}$ alkyl group is a n-propyl group, isopropyl group, n-butyl group, isobutyl group, sec-butyl group or tert-butyl group; or
   wherein in the formula 1,
   $X_1$ is NH,
   $X_2$ is $NR_5$, and
   $R_1$ to $R_3$ and $R_5$ are each independently a hydrogen atom, a $C_{1-4}$ alkyl group optionally substituted with a carboxyl group, an amino group, a hydroxy group, or —$CONH_2$; or
   wherein in the formula 1,
   $X_2$ is a single bond, and
   $R_1$ to $R_3$ are each independently a hydrogen atom, a $C_{1-4}$ alkyl group optionally substituted with a carboxyl group, an amino group, or a hydroxy group; and one or more of $R_1$ to $R_3$ is a hydrogen atom or one or more of the $C_{1-4}$ alkyl group is a n-propyl group, isopropyl group, n-butyl group, isobutyl group, sec-butyl group, or tert-butyl group; or
   wherein in the formula 1,
   $X_1$ is O or NH,
   $X_2$ is a single bond or $NR_5$, and
   $R_1$ to $R_3$ and $R_5$ are each independently a hydrogen atom or a $C_{1-4}$ alkyl group optionally substituted with a carboxyl group and when $X_2$ is a single bond, one or more of $R_1$ to $R_3$ is a hydrogen atom or one or more of the $C_{1-4}$ alkyl group is a n-propyl group, isopropyl group, n-butyl group, isobutyl group, sec-butyl group, or tert-butyl group; and when $X_2$ is $NR_5$, one or more of $R_1$ to $R_3$ and $R_5$ is a hydrogen atom, wherein when $R_1$ and $R_2$ are hydrogen atoms or $R_3$ and $R_5$ are hydrogen atoms, one or more of the $C_{1-4}$ alkyl group is a n-propyl group, isopropyl group, n-butyl group, isobutyl group, sec-butyl group, or tert-butyl group,
   and the polishing composition has a pH less than 5.0.

2. The polishing composition according to claim 1, wherein the additive is 1,3-dimethylurea, guanylurea phosphate, dimethylisobutyramide, N-ethylacetamide, creatine hydrate, N-acetyl ethylenediamine, or 2-acetamidoethanol.

3. A polishing method comprising polishing an object to be polished using the polishing composition as defined in claim 1.

4. The polishing composition according to claim 1, wherein the pH is 4.6 or less.

5. A method for producing a polishing composition for use in polishing an object to be polished, comprising mixing abrasive grains, a dispersing medium, and an additive,
   wherein the abrasive grains are surface-modified,
   the additive is represented by the following formula 1:

[Chemical Formula 1]

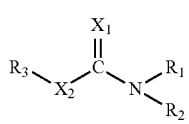

(Formula 1)

wherein in the formula 1,
   $X_1$ is O,
   $X_2$ is $NR_5$, and
   two or more of $R_1$ to $R_3$ and $R_5$ are a $C_{1-4}$ alkyl groups optionally substituted with a carboxyl group, an amino group, or a hydroxy group and one or more of $R_1$ to $R_3$ and $R_5$ is a hydrogen atom and when $R_1$ and $R_2$ are hydrogen atoms or $R_3$ and $R_5$ are hydrogen atoms, one or more of the $C_{1-4}$ alkyl group is a n-propyl group, isopropyl group, n-butyl group, isobutyl group, sec-butyl group, or tert-butyl group; or
   wherein in the formula 1,
   $X_1$ is NH,
   $X_2$ is $NR_5$, and
   $R_1$ to $R_3$ and $R_5$ are each independently a hydrogen atom, a $C_{1-4}$ alkyl group optionally substituted with a carboxyl group, an amino group, a hydroxy group, or —$CONH_2$; or
   wherein in the formula 1,
   $X_2$ is a single bond, and
   $R_1$ to $R_3$ are each independently a hydrogen atom, a $C_{1-4}$ alkyl group optionally substituted with a carboxyl group, an amino group, or a hydroxy group; and one or more of $R_1$ to $R_3$ is a hydrogen atom or one or more of the $C_{1-4}$ alkyl group is a n-propyl group, isopropyl group, n-butyl group, isobutyl group, sec-butyl group, or tert-butyl group; or wherein in the formula 1, $X_1$ is O or NH, $X_2$ is a single bond or $NR_5$, and $R_1$ to $R_3$ and $R_5$ are each independently a hydrogen atom or a $C_{1-4}$ alkyl group optionally substituted with a carboxyl group and when $X_2$ is a single bond, one or more of $R_1$ to $R_3$ is a hydrogen atom or one or more of the $C_{1-4}$ alkyl group is a n-propyl group, isopropyl group, n-butyl group, isobutyl group, sec-butyl group, or tert-butyl group; and when $X_2$ is $NR_5$, one or more of $R_1$ to $R_3$ and $R_5$ is a hydrogen atom, wherein when $R_1$ and $R_2$ are hydrogen atoms or $R_3$ and $R_5$ are hydrogen atoms, one or more of the $C_{1-4}$ alkyl group is a n-propyl group, isopropyl group, n-butyl group, isobutyl group, sec-butyl group, or tert-butyl group, and the polishing composition has a pH less than 5.0.

6. The method according to claim 5, wherein the additive is 1,3-dimethylurea, guanylurea phosphate, dimethylisobutyramide, N-ethyl acetamide, creatine hydrate, N-acetylethylenediamine, or 2-acetamidoethanol.

7. The method according to claim 5, wherein the pH is 4.6 or less.

* * * * *